United States Patent
Conboy et al.

(10) Patent No.: US 6,556,882 B1
(45) Date of Patent: Apr. 29, 2003

(54) METHOD AND APPARATUS FOR GENERATING REAL-TIME DATA FROM STATIC FILES

(75) Inventors: Michael R. Conboy, Austin, TX (US); Elfido Coss, Jr., Austin, TX (US); Qingsu Wang, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/401,089

(22) Filed: Sep. 22, 1999

(51) Int. Cl.[7] .............................................. G06F 19/00
(52) U.S. Cl. ...................... 700/108; 700/121; 702/183
(58) Field of Search .................. 700/108, 51, 109–110, 700/121; 702/183; 703/13, 14

(56) References Cited

U.S. PATENT DOCUMENTS

| | | | | | |
|---|---|---|---|---|---|
| 5,475,624 A | * | 12/1995 | West | ............................ | 703/13 |
| 5,486,995 A | * | 1/1996 | Krist et al. | .................... | 700/29 |
| 5,711,843 A | * | 1/1998 | Jahns | .......................... | 156/345 |
| 5,841,652 A | * | 11/1998 | Sanchez | ....................... | 700/44 |
| 5,859,964 A | * | 1/1999 | Wang et al. | ................... | 714/48 |
| 5,864,773 A | * | 1/1999 | Barna et al. | ................... | 702/85 |
| 5,866,437 A | * | 2/1999 | Chen et al. | .................... | 438/14 |
| 6,056,781 A | * | 5/2000 | Wassick et al. | ................ | 703/12 |
| 6,223,144 B1 | * | 4/2001 | Barnett et al. | ................ | 703/14 |
| 6,263,255 B1 | * | 7/2001 | Tan et al. | .................... | 700/121 |
| 6,263,412 B1 | * | 7/2001 | Townsend | .................... | 711/104 |

* cited by examiner

*Primary Examiner*—Leo Picard
*Assistant Examiner*—Kidest Bahta
(74) *Attorney, Agent, or Firm*—Williams, Morgan & Amerson, P.C.

(57) ABSTRACT

A method and apparatus for performing manufacturing system analysis upon a manufacturing network. Real-time production data is collected. The real-time production data is stored in a static file database. A real-time data flow is emulated using said real-time production data from said static file database. A reactive function analysis is performed.

30 Claims, 5 Drawing Sheets

METHOD AND APPARATUS FOR GENERATING REAL-TIME DATA FROM STATIC FILES

BACKGROUND OF THE INVENTION

1. Field of the Invention

This invention relates generally to semiconductor fabrication technology, and, more particularly, to a method and apparatus for generating real-time data from static files in an Advanced Process Control (APC) framework of a semiconductor manufacturing process.

2. Description of the Related Art

There is a constant drive in the semiconductor industry to increase the quality, reliability, and throughput of integrated circuit devices such as microprocessors, memory devices and the like. This drive is fueled by consumer demands for higher quality computers and electronic devices that operate more reliably.

These demands by the consumer have resulted in some improvements in the manufacture of semiconductor devices as well as in the manufacture of integrated circuit devices incorporating such semiconductor devices. Reducing the defects in the manufacture of these devices lowers the cost of the devices themselves. Accordingly, the cost of the final product incorporating these devices is also reduced, providing inherent monetary benefits to both the consumer and manufacturer.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the important aspects in semiconductor device manufacturing are RTA control, chemical-mechanical (CMT) control, etching, and overlay control. Overlay is one of several important steps in the photolithography area of semiconductor manufacturing. Overlay process involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for reduced of misalignment errors increases dramatically.

Generally, photolithography engineers currently analyze the overlay errors a few times a month. The results from the analysis of the overlay errors are used to make updates to exposure tool settings manually. Generally, a manufacturing model is employed to control the manufacturing processes. Some of the problems associated with the current methods include the fact that the exposure tool settings are only updated a few times a month. Furthermore, currently the exposure tool updates are performed manually. Many times, errors in semiconductor manufacturing are not organized and reported to quality control personal. Often, the manufacturing models themselves incur bias errors that could compromise manufacturing quality. Predicting system output responses and reducing errors is very important in efficiently manufacturing semiconductor devices.

The present invention is directed to overcoming, or at least reducing the effects of, one or more of the problems set forth above.

SUMMARY OF THE INVENTION

In one aspect of the present invention, a method is provided for performing manufacturing system analysis upon a manufacturing network. Real-time production data is collected. The real-time production data is stored in a static file database. A real-time data flow is emulated using said real-time production data from said static file database. A reactive function analysis is performed.

In another aspect of the present invention, an apparatus is provided for performing manufacturing system analysis upon a manufacturing network. The apparatus provided by the present invention comprises: a network including a network bus; a first system including a first interface, the first interface adapted to couple the first system to the network bus to permit bi-directional communication between the first system and the network; a data stream capture unit coupled with said network bus; a second system including a second interface, the second interface adapted to couple the second system to the data stream capture unit to permit bi-directional communication between the second system and the network; and a determining unit adapted to determine if the second system is functioning with the network in accordance with a predetermined standard.

BRIEF DESCRIPTION OF THE DRAWINGS

The invention may be understood by reference to the following description taken in conjunction with the accompanying drawings, in which like reference numerals identify like elements, and in which.

Figure 1A:
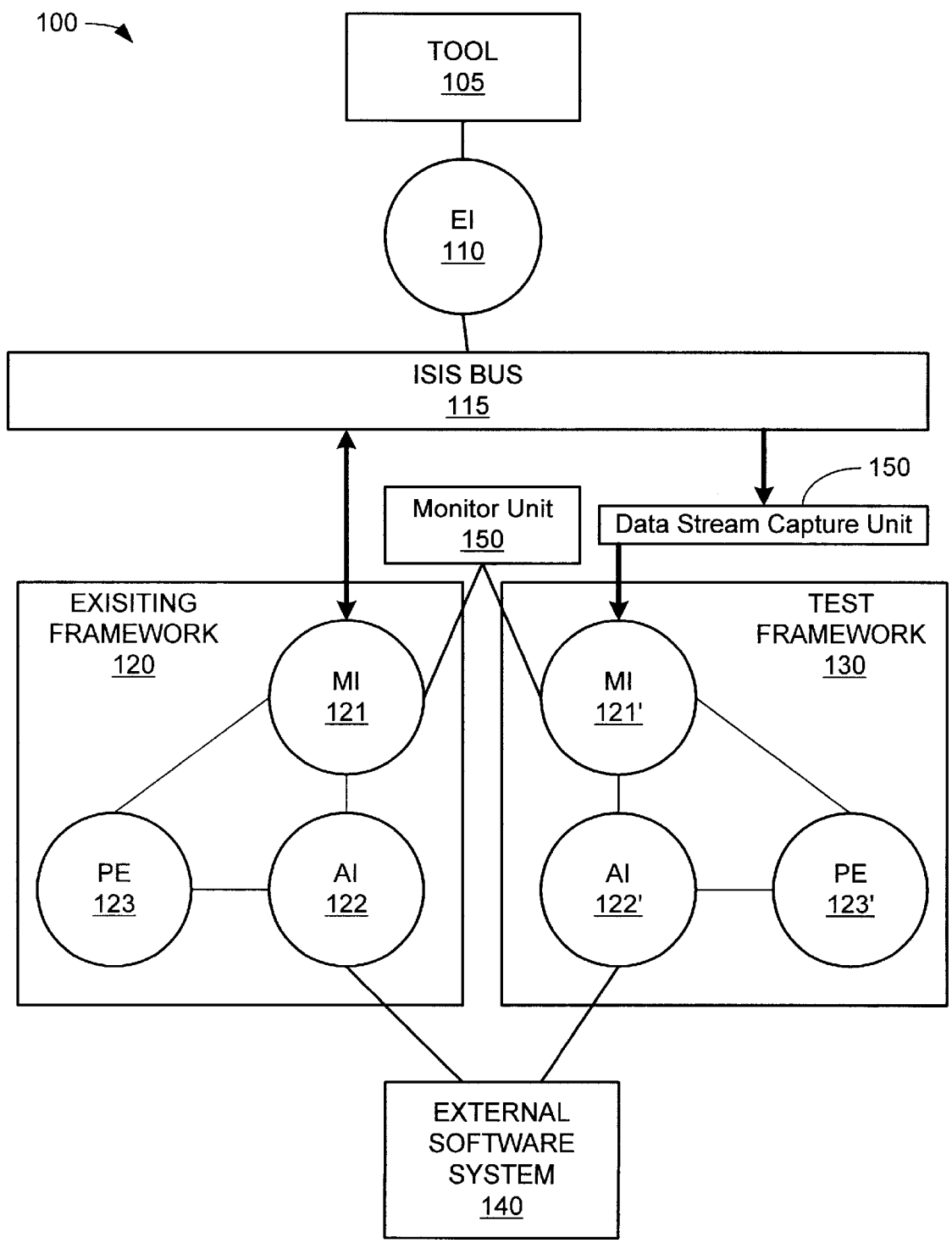
FIGS. 1A and B illustrate a semiconductor manufacturing network that depicts an existing APC framework to an test APC framework in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1A, a system 100 for implementing an existing and a test control system, such as Advanced Process Control (APC) framework is provided. The system 100 includes a processing tool 105, which in the illustrated embodiment is in the form of semiconductor fabrication equipment used to produce a processing piece, such as a silicon wafer, for example. The processing tool 105, in accordance with one embodiment, may be an exposure tool, commonly known as a "stepper." It will be appreciated, however, that the processing tool 105 need not necessarily be limited to a stepper, or even to a tool for producing silicon wafers, but could include other types of manufacturing equipment for producing a variety of different types of commercial products without departing from the spirit and scope of the present invention.

The processing tool 105 is coupled to an equipment interface (EI) 110, which retrieves various operational data from the tool 105, and communicates this data to an APC framework 120 via an ISIS bus 115. The ISIS bus 115 is a communication messaging system that transmits messages containing the operational data from the processing tool 105 via the equipment interface 110 to the APC framework 120. The equipment interface 110, in addition to receiving the operational data, may also forward signals received from the APC framework 120 to the processing tool 105. These signals that are sent by the APC framework 120 may be used to control the processing tool 105 in response to the operational data received from the tool 105, for example.

The APC framework 120 is a component-based architecture comprised of interchangeable, standardized software components enabling run-to-run control and fault detection of the processing tool 105. Typically, the APC framework 120 couples to an external software system 140 that evaluates the operational characteristics of the processing tool 105. In one embodiment, the external software system 140 may be in the form of a fault detection unit, which determines if the processing tool 105 is producing faulty wafers based upon the operational data collected through the equipment interface 110. It will be appreciated, however, that the external software system 140 need not necessarily be limited to fault detection, but may include other evaluation-type protocols that are compatible with the APC framework 120.

The APC framework 120 includes a machine interface (MI) 121, which couples to the equipment interface 110 via the ISIS bus 115, to serve as an interface between the processing tool 105 and the APC framework 120. The machine interface 121 supports the setup, activation, monitoring, and data collection of the processing tool 105. It also receives commands, status events, and collected data from the equipment interface 110 and forwards this information to other components of the APC framework 120, namely a plan executor 123 and an applications interface 122 (which are described later). Any responses that are received by the machine interface 121 from the other components of the APC framework 120 are routed to the equipment interface 110 via the ISIS bus 115 for delivery to the processing tool 105. As previously discussed, this may include a signal from the plan executor 123 to manipulate the tool 105 if a faulty condition is detected by the external software system 140, for example.

The machine interface 121 also reformats and restructures the messages between the specific communications protocol utilized by the equipment interface 110 and the Common Object Request Broker Architecture Interface Definition Language (CORBA IDL) communications protocol used by the components of the APC framework 120. The manner in which the machine interface 121 performs such translation between the equipment interface-specific communications protocol and the CORBA IDL protocol of the APC framework 120 is well known to those of ordinary skill in the art. Accordingly, the specific translation process between these two formats will not be discussed herein to avoid unnecessarily obscuring the present invention.

The plan executor (PE) 123 (i.e., process controller) executes user-defined process control plans among the APC framework components for the processing tool 105. In accordance with one embodiment, the plan executor 123 may perform control functions based upon the results received from the external software system 140 employing a fault detection application running thereon, for example. In this particular embodiment, the plan executor 123 attempts to rectify any fault conditions found with the tool 105. For example, a solution to the fault condition may be for the plan executor 123 to send a control signal to the machine interface 121 to shut down the tool 105 so as to prevent further manufacturing of faulty silicon wafers. The plan executor 123, in addition to shutting down the tool 105, may also apprise a technician of any potential solutions to rectify the fault condition through an operator interface (not shown), for example.

The applications interface 122 supports the integration of the external software system 140, which runs various commercial software packages, such as ModelWare®, MatLab®, Matrix-X®, and Mathematica, for example. Typically, these third-party applications that run on the external software system 140 do not provide the standard CORBA IDL protocol known to the APC framework 120. Accordingly, the applications interface 122 provides the necessary translation between the communications protocol utilized by the third-party tool and the CORBA protocol used by the APC framework 120. As previously discussed, the third-party application running on the external software system 140 may be for purposes of fault detection of the processing tool 105. It will be appreciated that, although the operation of the APC framework 120 was discussed with regard to fault detection of the processing tool 105, several other operations may be performed by the framework 120. Accordingly, the above-described operation of the APC framework 120 need not necessarily be limited to fault detection.

Figure 1B:
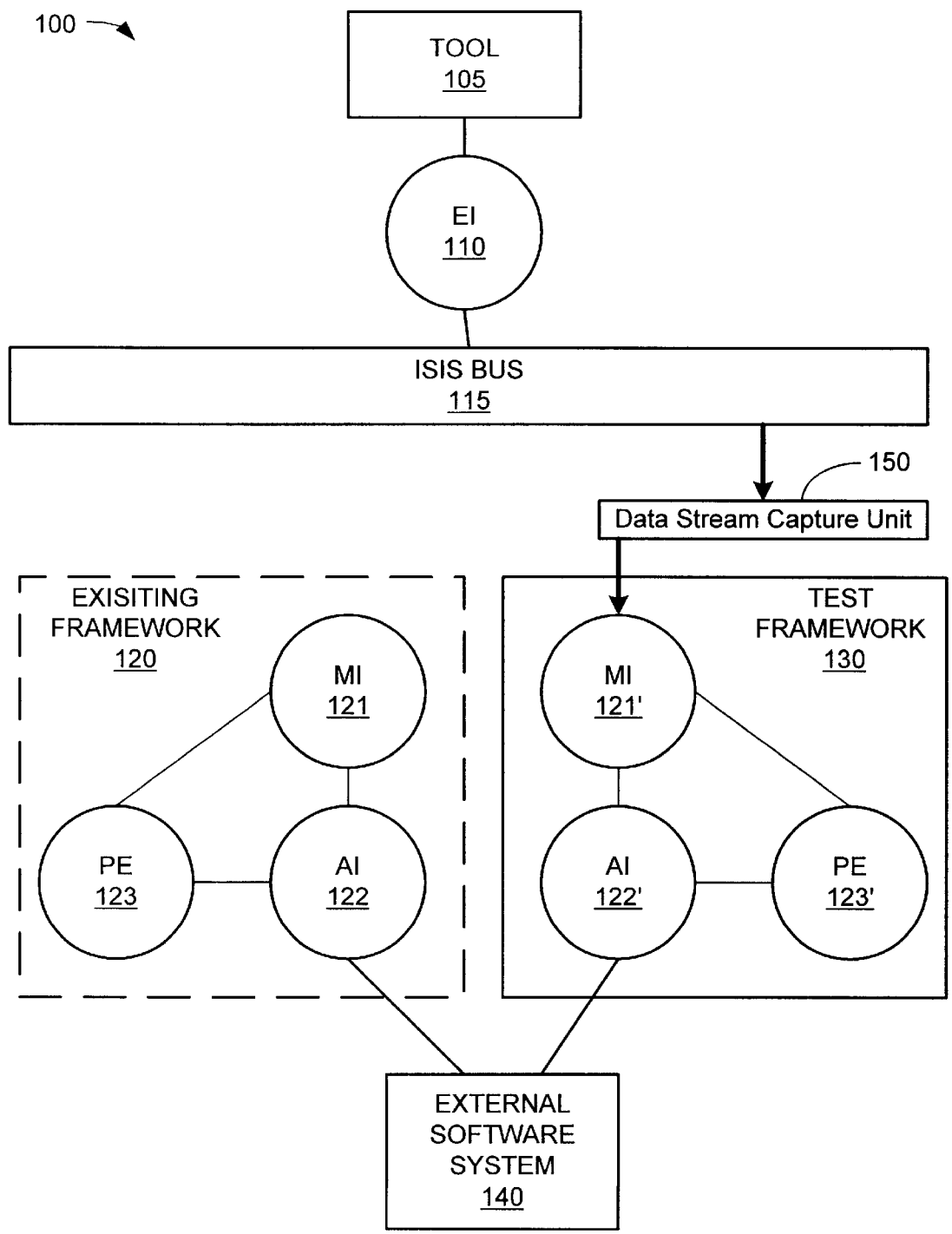

When improvements in the APC framework 120 are desired to enhance the performance of the system 100 illustrated in FIGS. 1A and 1B, correction to the existing framework 120 can be made by performing reactive function analysis using the test framework 130. A data stream capture unit 150 is used to send streams of production data to the test machine interface 121' in the test framework 130. In one embodiment, the existing framework 120 can be inactive while the test framework 130 is active. When the existing framework 120 is shutdown, the processing tool 105 cannot manufacture any processing pieces because the plan executor 123 is no longer operational to control the tool 105.

In accordance with the illustrated embodiment of the present invention, a test APC framework 130, which contains test components such as an test machine interface 121', applications interface 122', and plan executor 123', for example, is coupled to the ISIS bus 115 (through the data stream capture unit 150) to operate in parallel with the existing framework 120. In one embodiment, the machine interface 121 of the existing framework 120 remains in a two-way "input/output" mode. That is, the machine interface 121 of the existing framework 120 may receive signals from the equipment interface 110 and may send signals from the plan executor 123 of the existing framework 120 to the equipment interface 110. The test machine interface 121' of the test framework 130, on the other hand, is initially configured in a "listen-only" mode. In the "listen-only" mode, the test framework 130 may receive signals from the equipment interface 110, but may not send signals to the equipment interface 110.

While the existing framework 120 and the test framework 130 are running in parallel, a monitoring unit 150 is able to compare the operation of the two frameworks 120, 130 simultaneously, and determine if the test framework 130 is operating in accordance with a predetermined standard. In one embodiment, the predetermined standard may be that the test framework 130 performs the same tasks as the existing framework 120. For example, if the external software system 140 detects a fault condition with the tool 105 and the plan executor 123 of the existing framework 120 sends a signal to rectify the fault, the monitoring unit 150 can ascertain whether the plan executor 123' of the test framework 130 is also sending the same rectification signal (although in actuality, the test framework 130 is prohibited from sending the rectification signal to the ISIS bus 115 because it is in a "listen-only" mode). Accordingly, while the test framework 130 is in a "listen-only" mode, the test framework 130 can be tested and compared to the existing framework 120 by the monitoring unit 150 without jeopardizing the manufacturing process (provided that the test framework 130 is working improperly).

Referring to FIG. 1B, when it is determined that the manufacturing network system illustrated in FIG. 1B is to be operated separately, the machine interface 121 of the existing framework 120 is uncoupled from the ISIS bus 115, and the machine interface 121' of the test framework 130 is re-initialized to operate in a two-way mode. Accordingly, the test framework 130 has completely replaced the existing framework 120, and now receives signals from the equipment interface 110 and sends control signals to the equipment interface 110 for clearing faults with the tool 105, for example.

Figure 2:
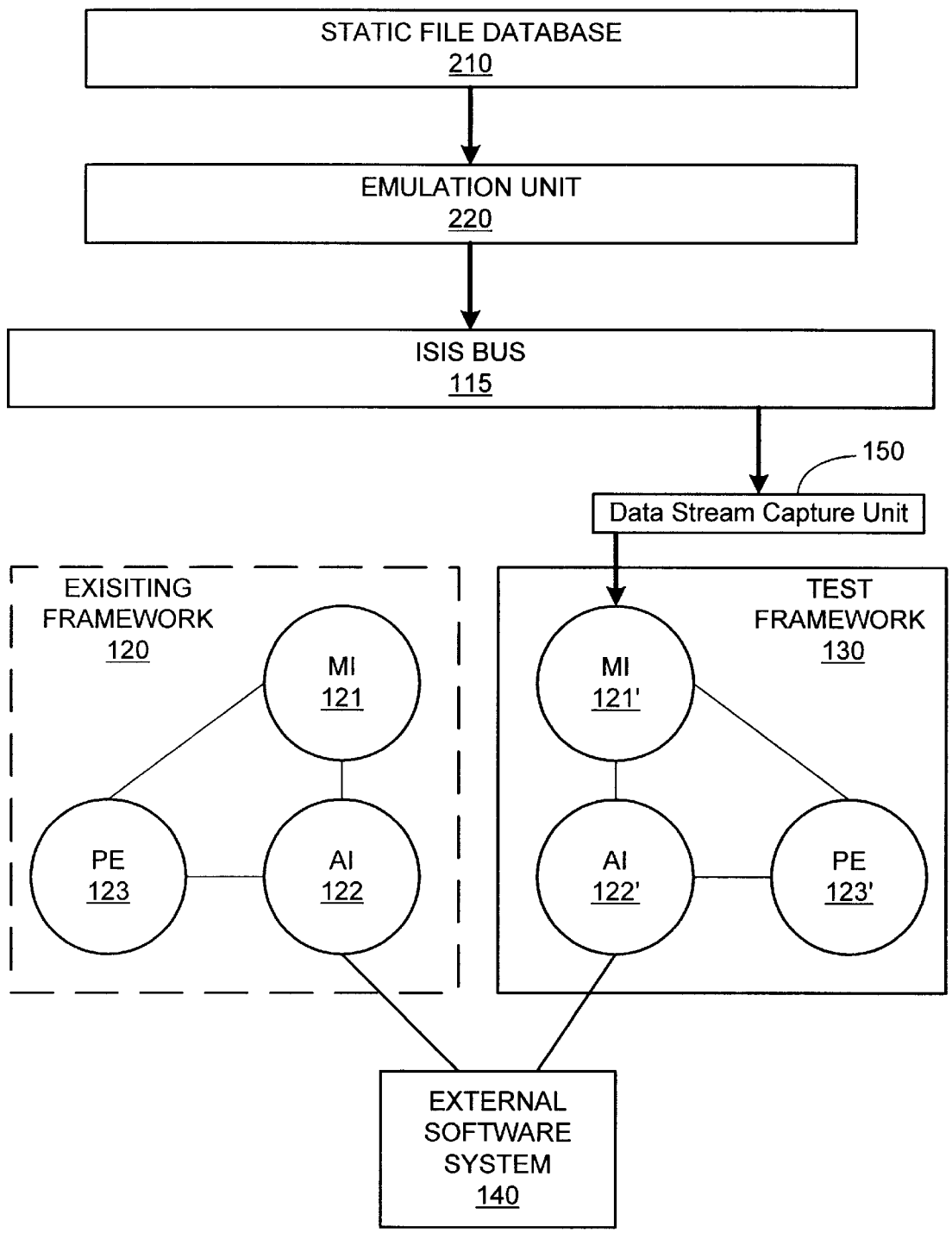
FIG. 2 illustrates a semiconductor manufacturing network that depicts one embodiment of performing a production data emulation described by the present invention.

Turning now to FIG. 2, a semiconductor manufacturing network that depicts one embodiment of performing a production data emulation described by the present invention, is illustrated. A static file database 210 that stores production data is created. In one embodiment, the production data that is stored in the static file database 210 includes data captured from manufacturing processes of semiconductor devices, such as semiconductor wafers. The static file database 210 may also contain fabricated data that represents a predicted behavior of data that would be collected in a semiconductor device manufacturing process.

An emulation unit 220 then collects static production files from the static file database 310 and processes them. In one embodiment, the emulation unit 220 acquires data from the static file database 210 and emulates a real-time data flow using the static production files from the static file database 210. The emulated real-time data is sent through the ISIS bus 115 onto the data stream capture unit 150. The data stream capture unit 150 provides a real-time data flow to the test machine interface 121' in the test framework 130. In one embodiment, the test framework 130 operates as though it were receiving data from a tool 105 and an equipment interface 110 that are part of the manufacturing network system illustrated in FIG. 1B. Hence, the manufacturing network system illustrated in FIG. 2 is capable of operating in an emulation mode.

Figure 3:
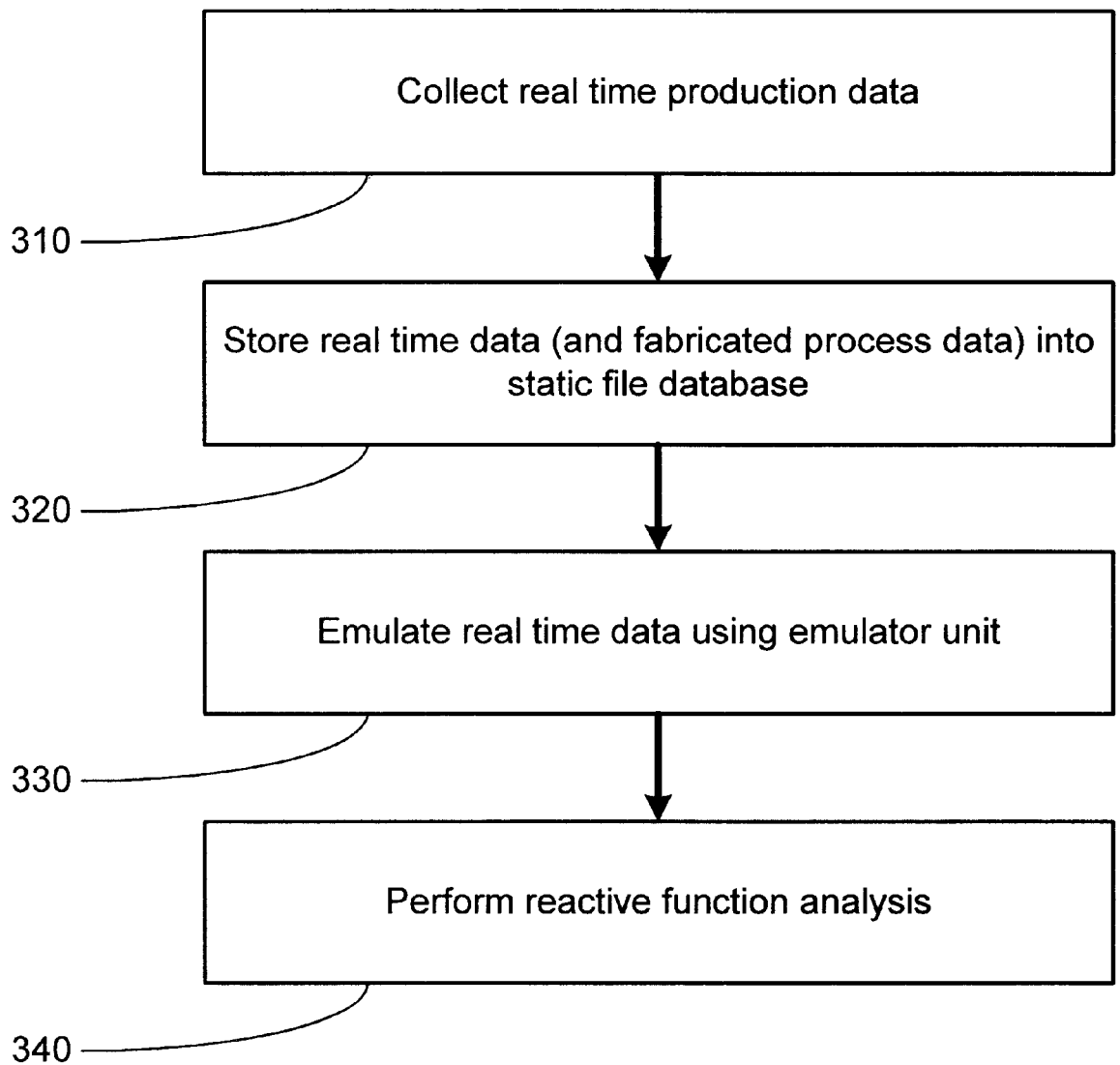
FIG. 3 illustrates a flowchart depiction of one embodiment of a method for performing a reactive function analysis taught by the present invention.

Turning now to FIG. 3, a flowchart depiction of one embodiment of a method for performing a reactive function analysis taught by the present invention, is illustrated. In one embodiment, a set of real-time production data is collected, as described in block 310 of FIG. 3. The real-time production data that is collected includes process data that is collected from actual processing of semiconductor devices. The collected real-time data is stored into the static file database 210, as described in block 320 of FIG. 3. In one embodiment, fabricated process data files are also stored in the static file database 210.

Once a set of static production files is stored into the static file database 310, the static production files can be accessed by the emulation unit 220. In one embodiment, the emulation unit 220 is a computer software program. The emulation unit 220 access the static files from the static file database 310 and performs a real-time data flow emulation, as described in block 330 of FIG. 3. In one embodiment, the emulated real-time data from the emulation unit 220 is sent to the ISIS bus 115, to be sent to the test framework 130. In an alternative embodiment, the ISIS bus 115 receives real-time data from the tool 105 and the equipment interface 110. A reactive function analysis is performed, as described in block 340 of FIG. 3. In one embodiment, the reactive function analysis is performed using the reactive manufacturing network system that are described in FIGS. 1A, 1B, and 2.

Figure 4:
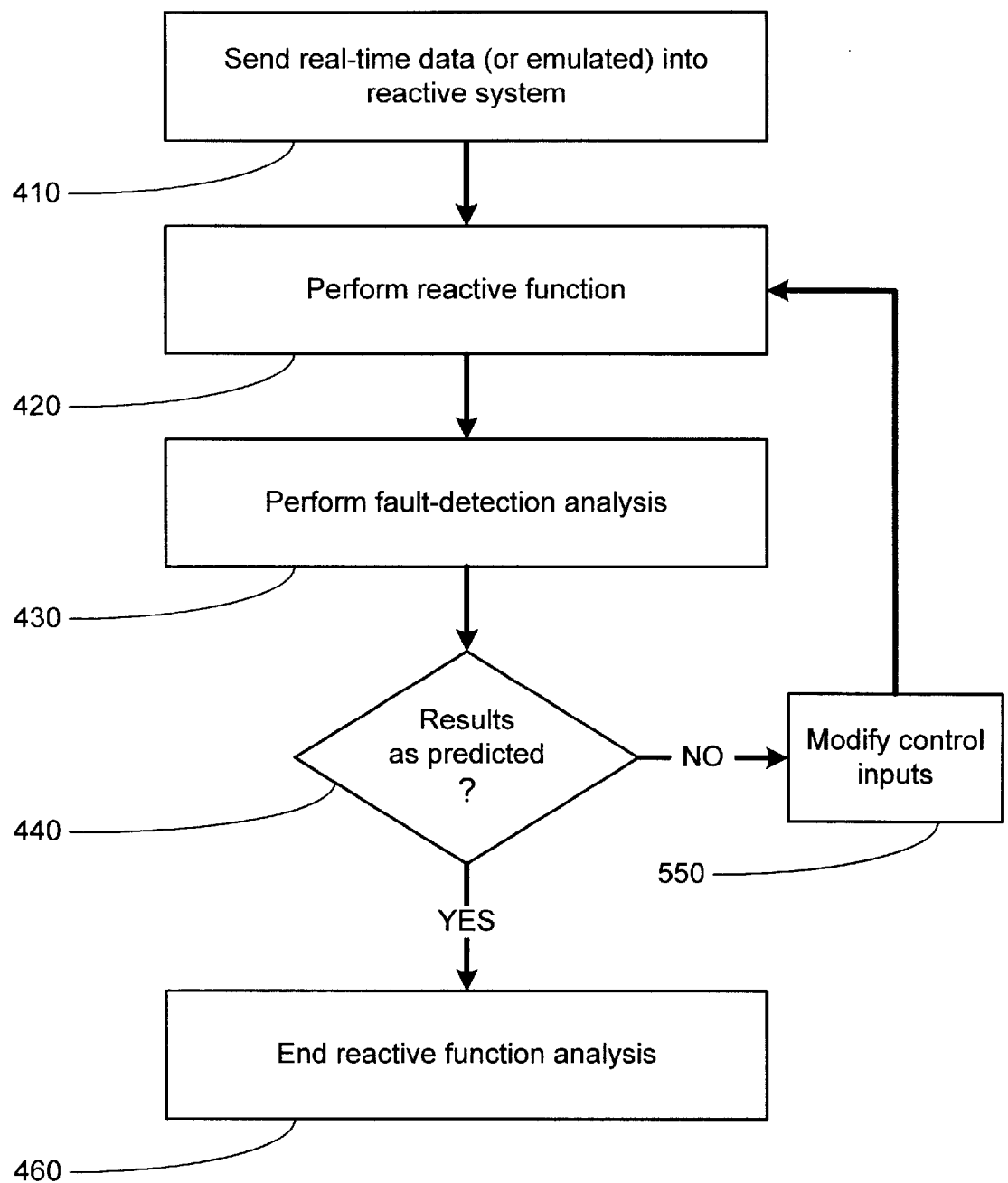
FIG. 4 illustrates flowchart representation of a more detailed depiction of the step of performing reactive function analysis described in FIG. 3.

Turning now to FIG. 4, a flowchart representation of a more detailed embodiment of the reactive function analysis described in FIG. 3, is illustrated. Real-time data is sent into a reactive system for operating the reactive system, as described in block 410 of FIG. 4. In one embodiment, the reactive system is the manufacturing network system described in FIG. 1A. In one embodiment, the real-time data includes actual real-time data acquired from semiconductor manufacturing processes and emulated real-time data that is produced by the emulation unit 220. A reactive function is performed, as described in block 420 of FIG. 4.

The reactive function described in block 420 is comprised of processing and analyzing the real-time data in the test framework 130. In one embodiment, the APC system compares the results processed by the test framework 130 and the existing framework 120. A fault-detection analysis is then performed using the results of the process performed by the test framework 130. Multiple manufacturing conditions can be tested using the test framework 130. Different control input signals that control manufacturing processing can be employed in the test framework 130, and their results can be compared to predicted behavior. The fault detection analysis can be utilized to modify the control input signals that control semiconductor manufacturing processes.

A determination is made whether the results from performing the reactive function analysis described above produce results that are approximately the same as a set of predicted results, as described in block 440 of FIG. 4. In one embodiment, a determination unit, which can be a computer software program, is utilized to perform the determination task described in block 440 of FIG. 4. When a determination is made that the results from performing reactive function analysis using a particular set of real-time data are not approximately the same as the predicted results, control input signals are modified and the reactive function is repeated, as described in block 450 of FIG. 4. When a determination is made that the results from performing reactive function analysis using a particular set of real-time data are approximately the same as the predicted results, the reactive function analysis is terminated, as described in block 460 of FIG. 4. In one embodiment, the set of real-time data used by the test framework 130, which produced results that were approximately equal to the predicted results, is stored in a database (not shown) that can be accessed for future application. The principles taught by the present invention can be used in the context of other types of manufacturing.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for performing manufacturing system analysis upon a manufacturing network comprising:
    collecting real-time production data;
    storing said real-time production data in a static file database;
    emulating real-time data flow using said real-time production data from said static file database; and
    performing a reactive function analysis, said reactive function analysis comprises performing a fault detection analysis on a test processing function based upon said emulation.

2. The method of claim 1, wherein collecting real-time production data further comprises collecting process data from a process run of semiconductor devices.

3. The method of claim 1, wherein collecting real-time production data further comprises collecting fabricated process data from a database.

4. The method of claim 1, wherein emulating real-time data flow using said real-time production data further comprises simulating a flow of real-time production data.

5. The method of claim 1, wherein performing reactive function analysis further comprises:
    sending real-time data into a reactive system;
    performing a reactive function using said real-time data;
    performing fault-detection analysis on a result of performing said reactive function;
    determining whether said result of performing said reactive function is approximately same as a predicted result; and
    modifying a set of control inputs associated with said real-time data in response to a determination that said result of performing said reactive function is not approximately same as a predicted result.

6. The method of claim 5, wherein sending real-time data into a reactive system further comprises sending emulated data into a reactive system.

7. The method of claim 6, wherein sending real-time data into a reactive system further comprises sending real-time data into a reactive system into a test framework of a process control system.

8. The method of claim 6, wherein performing a reactive function using said real-time data further comprises executing a process control run of a test framework of a process control system using said real-time data.

9. An apparatus for performing manufacturing system analysis upon a manufacturing network, comprising:
    a network including a network bus, said network being capable of emulating real-time data flow using real-time production data;
    a first system including a first interface, the first interface adapted to couple the first system to the network bus to permit bi-directional communication between the first system and the network;
    a data stream capture unit coupled with said network bus;
    a second system including a second interface, the second interface adapted to couple the second system to the data stream capture unit to permit bi-directional communication between the second system and the network; and
    a determining unit adapted to determine if the second system is functioning with the network in accordance with a predetermined standard.

10. The apparatus of claim 9, wherein said network is coupled to an emulation unit that is capable of emulating a flow of real-time data.

11. The apparatus of claim 10, wherein said emulation unit is coupled to a static file database.

12. The apparatus of claim 11, wherein said static file database comprises at least one of production data from processing run of semiconductor devices and emulated production data.

13. The apparatus of claim 9, wherein the second interface is adapted to enable the second system to communicate bi-directionally with the network.

14. The apparatus of claim 13, wherein said second interface comprises a test framework of a process control system.

15. An apparatus for performing manufacturing system analysis upon a manufacturing network, comprising:
    a network including a network bus;
    a first Advanced Process Control (APC) framework including a first interface, the first interface adapted to couple the first APC framework to the network bus to permit bi-directional communication between the first APC framework and the network;
    a data stream capture unit coupled with said network bus;
    a second APC framework including a second interface, the second interface adapted to couple the second APC framework to the data stream capture unit to permit bi-directional communication between the second APC framework and the network; and
    a determining unit adapted to determine if the second APC framework is functioning with the network in accordance with a predetermined standard.

16. The apparatus of claim 15, wherein said network is coupled to an emulation unit that is capable of emulating a flow of real-time data.

17. The apparatus of claim 16, wherein said emulation unit is coupled to a static file database.

18. The apparatus of claim 17, wherein said static file database comprises at least one of production data from processing run of semiconductor devices and emulated production data.

19. The apparatus of claim 15, wherein the second APC framework is adapted to enable the second system to communicate bi-directionally with the network.

20. The apparatus of claim 15, wherein said second APC framework comprises a test framework.

21. The apparatus of claim 15, wherein the second APC framework is adapted to communicate bi-directionally with the network providing that the second APC framework was determined to be operating in accordance with the predetermined standard.

22. An apparatus for performing manufacturing system analysis upon a manufacturing network comprising:

means for collecting real-time production data;

means for storing said real-time production data in a static file database;

means for emulating real-time data flow using said real-time production data from said static file database; and means for performing a reactive function analysis, said reactive function analysis comprises performing a fault detection analysis on a test processing function based upon said emulation.

23. A computer readable program storage device encoded with instructions that, when executed by a computer, performs a method for performing manufacturing system analysis upon a manufacturing network comprising:

collecting real-time production data;

storing said real-time production data in a static file database;

emulating real-time data flow using said real-time production data from said static file database; and performing a reactive function analysis, said reactive fumction analysis comprises
performing a fault detection analysis on a test processing function based upon said emulation.

24. The computer readable program storage device encoded with instructions that, when executed by a computer, performs the method of claim 23, wherein collecting real-time production data further comprises collecting process data from a process run of semiconductor devices.

25. The computer readable program storage device encoded with instructions that, when executed by a computer, performs the method of claim 23, wherein collecting real-time production data further comprises collecting fabricated process data from a database.

26. The computer readable program storage device encoded with instructions that, when executed by a computer, performs the method of claim 23, wherein emulating real-time data flow using said real-time production data further comprises simulating a flow of real-time production data.

27. The computer readable program storage device encoded with instructions that, when executed by a computer, performs the method of claim 21, wherein performing reactive function analysis further comprises:

sending real-time data into a reactive system;

performing a reactive function using said real-time data;

performing fault-detection analysis on a result of performing said reactive function;

determining whether said result of performing said reactive function is approximately same as a predicted result; and modifying a set of control inputs associated with said real-time data in response to a determination that said result of performing said reactive function is not approximately same as a predicted result.

28. The computer readable program storage device encoded with instructions that, when executed by a computer, performs the method of claim 27, wherein sending real-time data into a reactive system further comprises sending emulated data into a reactive system.

29. The computer readable program storage device encoded with instructions that, when executed by a computer, performs the method of claim 28, wherein sending real-time data into a reactive system further comprises sending real-time data into a reactive system into a test framework of a process control system.

30. The computer readable program storage device encoded with instructions that, when executed by a computer, performs the method of claim 28, wherein performing a reactive function using said real-time data further comprises executing a process control run of a test framework of a process control system using said real-time data.

* * * * *

UNITED STATES PATENT AND TRADEMARK OFFICE
CERTIFICATE OF CORRECTION

PATENT NO. : 6,556,882 B1 Page 1 of 1
DATED : April 29, 2003
INVENTOR(S) : Michael R. Conboy, Elfido Coss, Jr. and Qingsu Wang It is certified that error appears in the above-identified patent and that said Letters Patent is hereby corrected as shown below:

Column 9,
Line 30, replace "fumction" with -- function --.

Signed and Sealed this

Eighth Day of July, 2003

JAMES E. ROGAN
*Director of the United States Patent and Trademark Office*